(12) United States Patent
Aydin

(10) Patent No.: US 6,678,320 B1
(45) Date of Patent: Jan. 13, 2004

(54) EFFICIENT FINITE IMPULSE RESPONSE FILTER IMPLEMENTATION FOR CDMA WAVEFORM GENERATION

(75) Inventor: Levent Aydin, Del Mar, CA (US)

(73) Assignee: Qualcomm, Incorporated, San Diego, CA (US)

( * ) Notice: Subject to any disclaimer, the term of this patent is extended or adjusted under 35 U.S.C. 154(b) by 0 days.

(21) Appl. No.: 09/144,533

(22) Filed: Aug. 31, 1998

(51) Int. Cl.[7] ................................................. H03H 7/30
(52) U.S. Cl. ........................................ 375/235; 375/140
(58) Field of Search ................................. 375/140, 141, 375/142, 143, 146, 147, 150, 152, 229, 232, 235; 370/206, 209, 335, 342, 320; 708/300, 301, 322, 323

(56) References Cited

U.S. PATENT DOCUMENTS

| | | | | |
|---|---|---|---|---|
| 5,506,865 A | * | 4/1996 | Weaver, Jr. | 370/335 |
| 5,623,485 A | * | 4/1997 | Bi | 370/209 |
| 5,671,221 A | * | 9/1997 | Yang | 370/320 |
| 6,064,690 A | * | 5/2000 | Zhou et al. | 375/142 |
| 6,141,372 A | * | 10/2000 | Chalmers | 375/147 |

* cited by examiner

Primary Examiner—Chieh M. Fan
(74) Attorney, Agent, or Firm—Philip R. Wadsworth; Charles D. Brown; Howard H. Seo

(57) ABSTRACT

A finite impulse response filter including a first circuit for providing plural delayed signals in response to an input signal. A second circuit is included for multiplying respective ones of the delayed signals by a corresponding coefficient and providing a respective intermediate signal in response thereto. A third circuit selectively changes the sign of respective ones of a first set of the intermediate output signals to provide a set of component in-phase signals. A fourth circuit selectively changes the sign of respective ones of a second set of the intermediate output signals to provide a set of component quadrature signals. The component in-phase signals are combined to provide an in-phase output signal and the component quadrature signals are combined to provide a quadrature output signal. In the illustrative implementation, the coefficients are generated in accordance with an industry standard via a storage device such as a register bank. The third and fourth circuits are controlled by a pseudo-noise sequence generator. The inventive implementation affords a considerable degree of efficiency in design in that in-phase and quadrature filter outputs are generated from a single filter thereby obviating the need for a second filter required by conventional teachings.

23 Claims, 8 Drawing Sheets

US 6,678,320 B1

EFFICIENT FINITE IMPULSE RESPONSE FILTER IMPLEMENTATION FOR CDMA WAVEFORM GENERATION

BACKGROUND OF THE INVENTION

1. Field of the Invention

The present invention relates to communications systems. More specifically, the present invention relates to systems and techniques for generating waveforms for code-division multiple access (CDMA) systems.

2. Description of the Related Art

Several digital modulation techniques are known in the art including code division multiple access (CDMA), time division multiple access (TDMA), and frequency division multiple access (FDMA). The spread spectrum modulation technique of CDMA has significant advantages over other digital modulation techniques. The use of CDMA techniques in a multiple access communication system is disclosed in U.S. Pat. No. 4,901,307, issued Feb. 13, 1990 to Gilhousen et al., entitled "SPREAD SPECTRUM MULTIPLE ACCESS COMMUNICATION SYSTEM USING SATELLITE OR TERRESTRIAL REPEATERS", assigned to the assignee of the present invention and incorporated by reference herein.

Typically, a plurality of analog signals from a public switched telephone network (PTSN) are digitized and consolidated into a high rate digital stream. The high rate digital stream is then disassembled into a plurality of packets which are distributed to a plurality of channel elements. The channel elements convolutionally encode the packets and perform numerous additional functions including adding CRC (cyclic redundancy checking) bits, convolutional encoding, power adjustment and orthogonal spreading using Walsh sequences. The outputs of the channel elements and a pilot signal are then typically summed and input to a waveform generator which creates a waveform suitable for transmission.

The method for providing digital wireless communications using CDMA was standardized by the Telecommunications Industry Association (TIA) in TIA/EIA/IS-95-A Mobile Station-Base Station Compatibility Standard for Dual-Mode Wideband Spread Spectrum Cellular System (hereafter IS-95). In accordance with this standard, transmission of voice and/or data from a base station over a forward link from a land line to a mobile unit requires the generation of specific waveforms by the CDMA transmission system. U.S. Pat. No. 5,103,459 ('459), issued Apr. 7, 1992 to Gilhousen et al., entitled "SYSTEM AND METHOD FOR GENERATING SIGNAL WAVEFORMS IN A CDMA CELLULAR TELEPHONE SYSTEM", (assigned to the assignee of the present invention and incorporated by reference herein) discloses and claims an advantageous system and technique for generating such waveforms for use in a CDMA cellular telephone system.

As disclosed by Gilhousen et al., the waveforms are generated through the use of finite impulse response (FIR) filters which band limit the transmit waveform Multiple voice/data channels are typically provided along with sync and paging channels. There may be as many as 64 channels in total. For each channel, two FIR filters are typically required to generate waveforms for the I and Q subchannels required for a quadrature output. Hence, for a typical system, as many as 128 FIR filters may be required, two for each channel.

As FIR filters are costly to implement, a need remains in the art for a system or technique allowing for a more efficient, less costly generation of waveforms for use in CDMA cellular telephone forward links and other applications.

SUMMARY OF THE INVENTION

The need in the art is addressed by the finite impulse response filter and filtering method of the present invention. The inventive filter includes a first circuit for providing plural delayed signals in response to an input signal. A second circuit is included for multiplying respective ones of the delayed signals by a corresponding coefficient and providing a respective intermediate signal in response thereto. A third circuit selectively changes the sign of respective ones of a first set of the intermediate output signals to provide a set of component in-phase signals. A fourth circuit selectively changes the sign of respective ones of a second set of the intermediate output signals to provide a set of component quadrature signals. The component in-phase signals are combined to provide an in-phase output signal and the component quadrature signals are combined to provide a quadrature output signal.

In the illustrative implementation, the coefficients are generated in accordance with an industry standard via a storage device such as a shift register. The third and fourth circuits are controlled by a pseudo-noise sequence generator.

The inventive implementation affords a considerable degree of efficiency in design in that in-phase and quadrature filter outputs are generated from a single filter thereby obviating the need for a second filter in accordance with conventional teachings.

BRIEF DESCRIPTION OF THE DRAWINGS

FIG. 6b is a timing diagram illustrative of the operation of the FIR filter of FIG. 6a.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility. For example, while the invention is described in the context of a multichannel transmit system, the use of a single channel transmit system is also possible.

Figure 1:
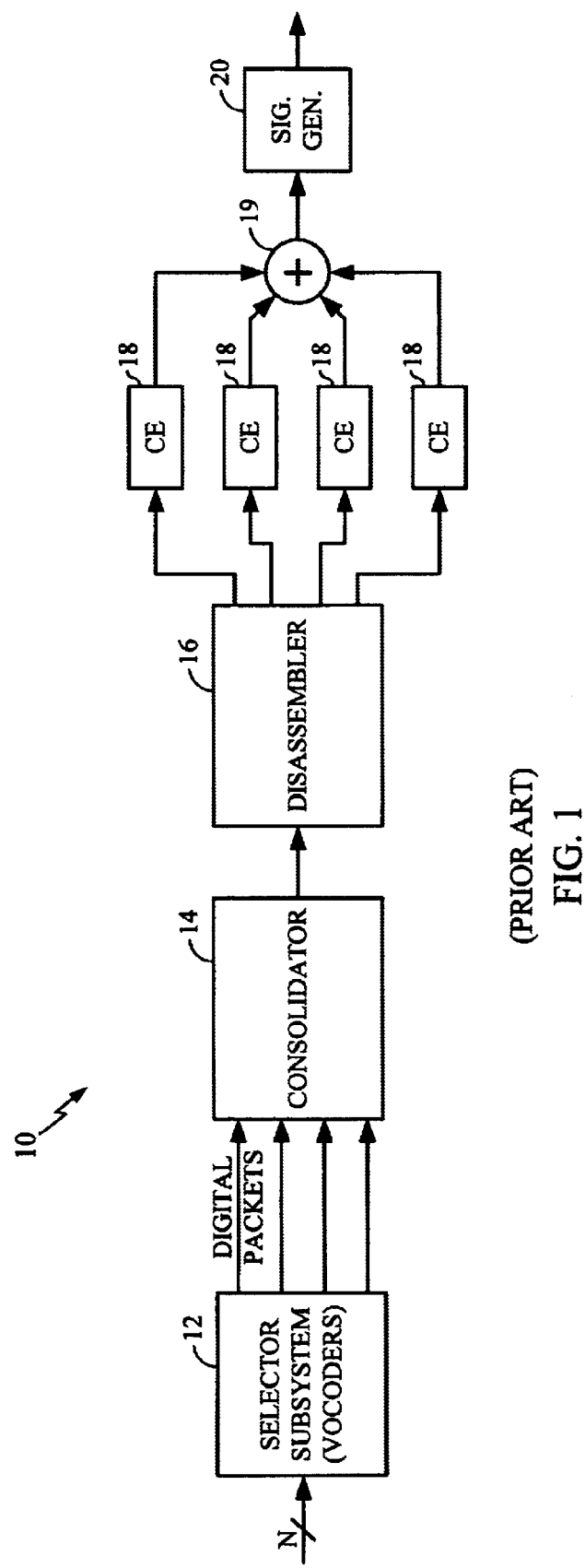
FIG. 1 is an illustrative simplified block diagram of a portion of a forward link of a conventional cellular telephone system.

FIG. 1 is an illustrative simplified block diagram of a portion of a forward link of a conventional cellular telephone system. A more detailed disclosure of an illustrative cellular telephone system is provided in the above-referenced patent issued to Gilhousen et al., the teachings of which have been incorporated herein by reference. In particular, see column 5, line 31 to column 25, line 27 of the referenced patent. The system 10 includes a selector 12 which receives analog voice and/or data input via a plurality of lines from a public switched telephone network (PSTN) (not shown). In a typical application, the selector subsystem 12 would include one or more vocoders (not shown). The vocoder may be implemented in the manner disclosed and claimed in U.S. Pat. No. 5,414,796, issued May 9, 1995, to Jacobs et al. entitled "VARIABLE RATE VOCODER", assigned to the assignee of the present invention and incorporated by reference herein.

The selector subsystem 12 outputs packets of digital data to a consolidator 14. The consolidator 14 converts multiple lines of digital input data to a single digital stream at a high data rate. The high data rate stream output from the consolidator 14 is input to a disassembler 16. The disassembler 16 distributes the digital stream to a plurality of channel elements 18. As is known in the art, the channel elements 18 add CRC bits and convolutionally encode each user's information bits, adjust transmission power and orthogonally spread the resulting coded symbols using Walsh sequences. In addition, one of the channel elements processes a pilot tone. The outputs of the channel elements 18 are combined by a summer 19 and input to a waveform generator 20. The waveform generator 20 is a function generator that provides an output waveform representative of the input data. The output waveform is transmitted to a cellular receiver (not shown).

Figure 2:
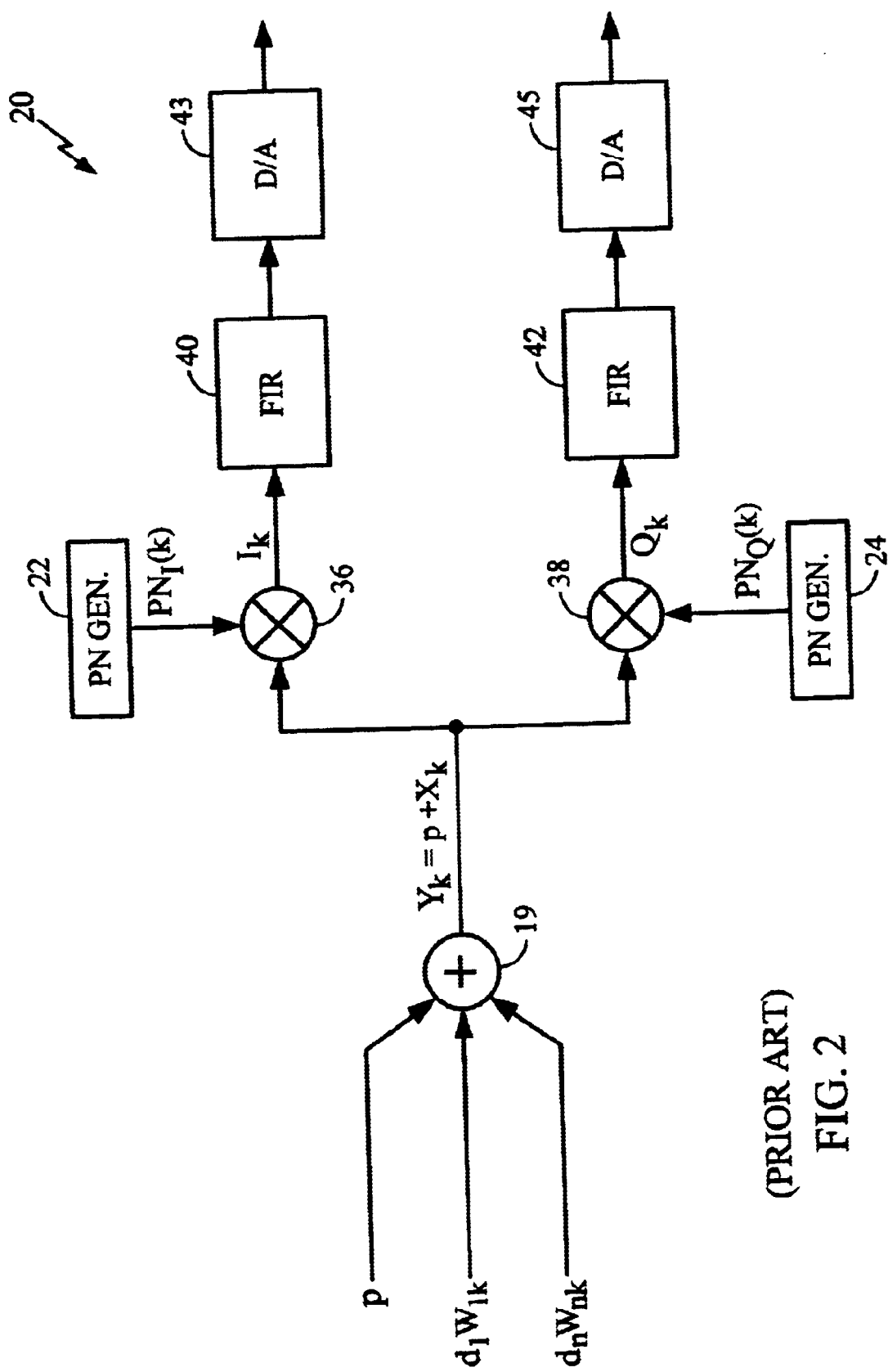
FIG. 2 is a simplified block diagram illustrative of a conventional implementation of a CDMA waveform generator.

FIG. 2 is a simplified block diagram illustrative of a conventional implementation of the waveform generator. The waveform generator 20 includes plural finite impulse response filters. Those skilled in the art will appreciate that the filtering and summing operations can be interchanged without affecting the result. In FIG. 2, $d_1, \ldots d_n$ refer to the coded symbols of n users and $W_{1k}$, denotes the k-th chip of the Walsh sequence with index '1'. $Y_k$ is the sum of all user chips and the chips for the pilot tone (which are all constants). This sum value is then multiplied by two pseudo-noise (PN) sequences identified by I (for in-phase) and Q (for quadrature phase). The I and Q PN sequences are provided by first and second PN sequence generators 22 and 24, respectively. FIG. 2 depicts a quadrature spreading digital modulation scheme in which a single stream of numbers $Y_k$ is spread with $PN_I(k)$ and $PN_Q(k)$.

Figure 3:
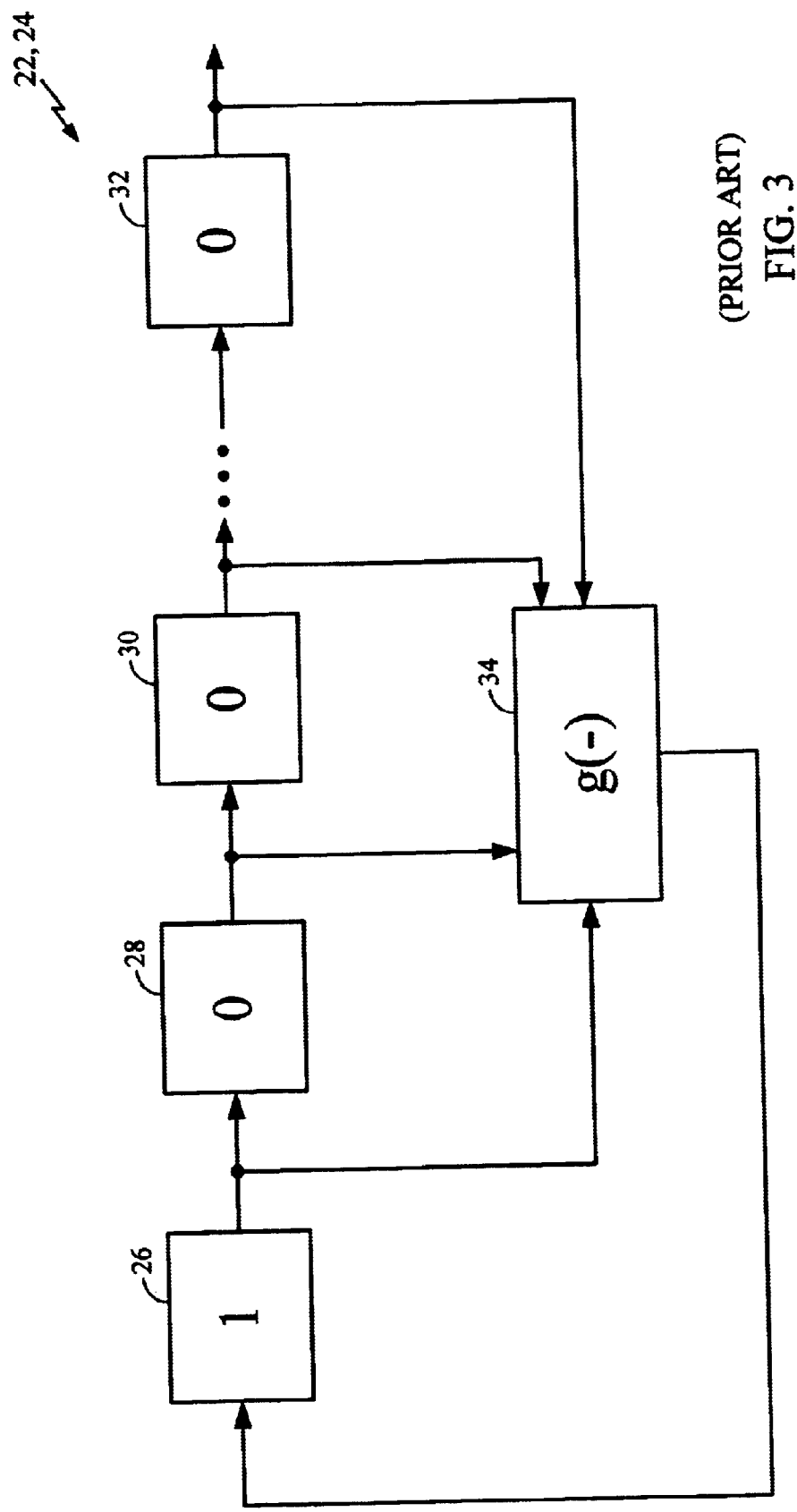
FIG. 3 is a simplified block diagram of a PN sequence generator.

FIG. 3 is a simplified block diagram of a PN sequence generator. As illustrated in FIG. 3, each PN sequence generator 22 and 24 includes a plurality of one-bit storage elements 26–32 (even numbers only). The output of each storage element provides an input to adjacent storage element. In addition, the outputs of each storage element are tapped and input to a Boolean generator function 34 whose output is input to the first storage element 26. The Boolean function can be represented as a polynomial with binary coefficients. In practice, the polynomial to be used is determined by the IS-95A industry standard referred to above. (See U.S. Pat. No. 5,504,773 entitled "Method and Apparatus for the Formatting of Data for Transmission" issued Apr. 2, 1996 to Padovani et al, assigned to the assignee of the present invention. The teachings of which are incorporated herein by reference.) As is known in the art, the polynomial determines which taps are utilized by the generator function 34. Those skilled in the art will appreciate that the PN sequences may be generated by a processor, shift register or other appropriate circuit.

Returning to FIG. 2, two sequences are generated ($PN_I$ and $PN_Q$). These sequences are a series of binary values (or positive and negative voltages) whose function is to randomize the sequence $Y_k$ to form two new sequences $I_k$ and $Q_k$ via multipliers 36 and 38 respectively. The sequences $I_k$ and $Q_k$ are input to two baseband pulse shaping FIR filters 40 and 42 respectively. A digital modulator employing a form of quadrature modulation such as QPSK (quadrature phase shift keying) modulation uses two baseband filters: one for in-phase and another for quadrature phase. Typically, both filters are identical to one another. Hence, in accordance with conventional teachings, two copies of the filter has to be implemented for each channel.

Figure 4:
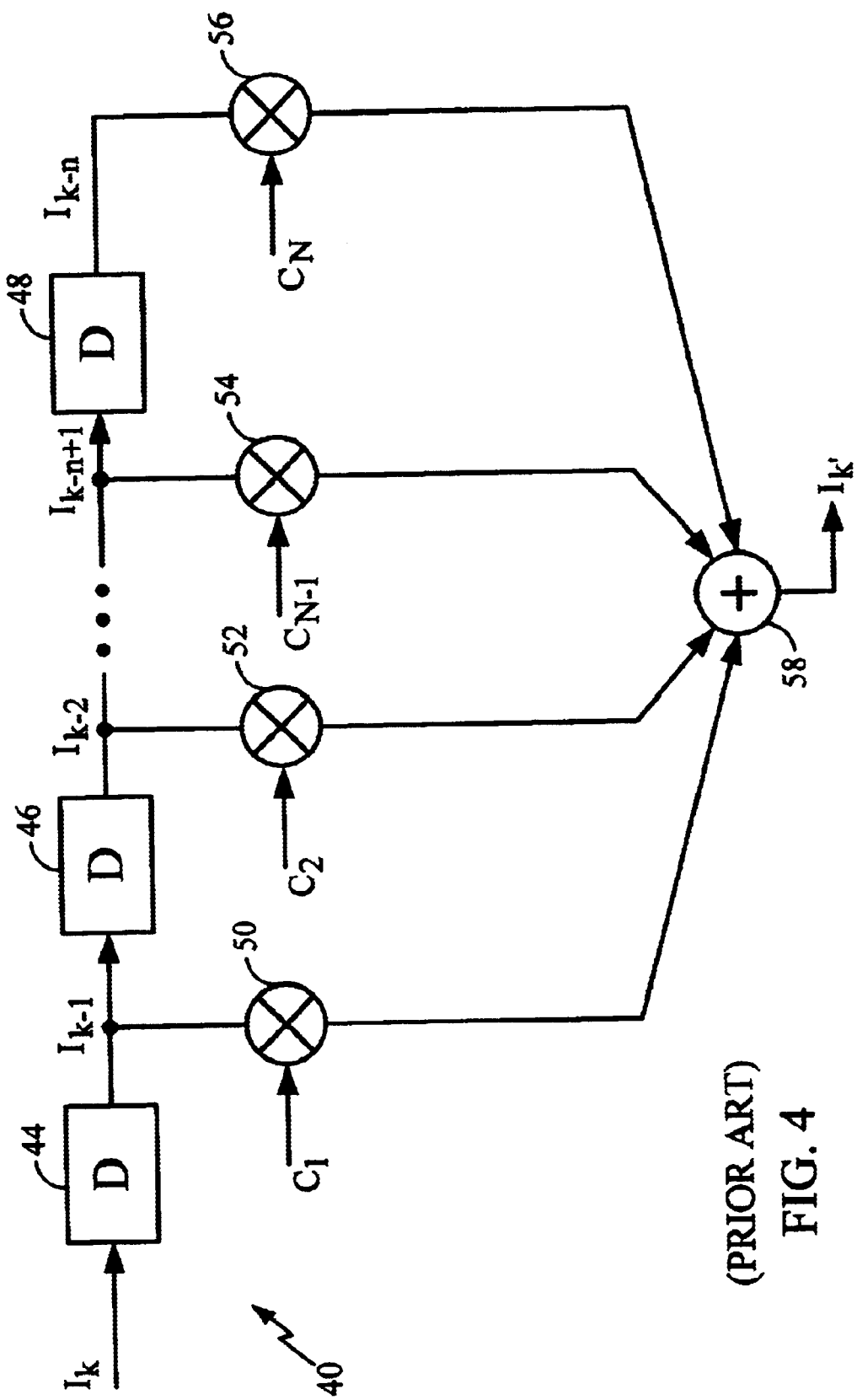
FIGS. 4 and 5 are block diagrams of a typical implementation of conventional FIR filters utilized in FIG. 3.
Figure 5:
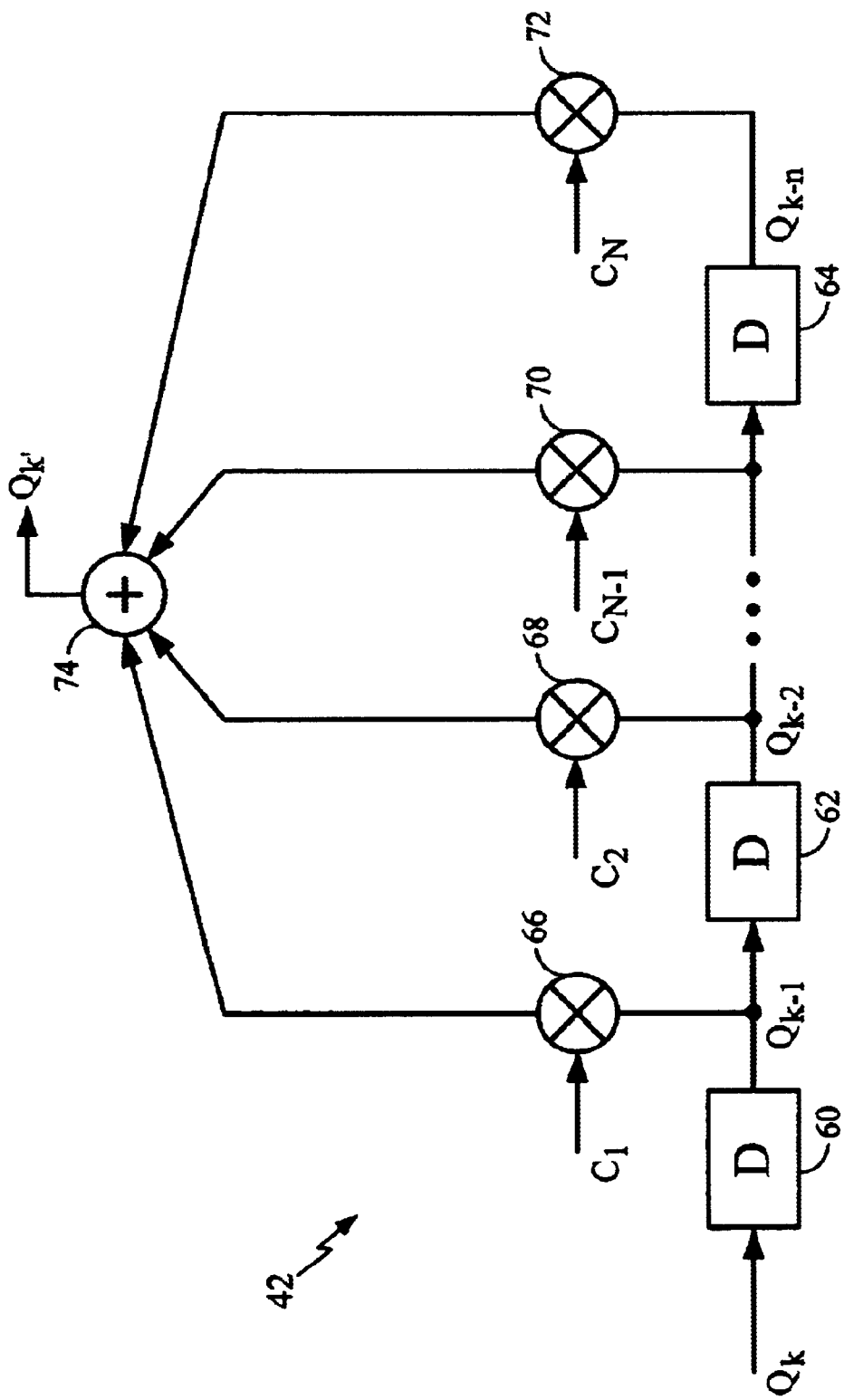

FIGS. 4 and 5 are block diagrams of a typical implementation of conventional FIR filters utilized in FIG. 3. As each filter is identical, only one is described here. Each filter 40 includes a plurality of delay elements 44–48 (even numbers only). An FIR filter is a linear filter whose output at any time sample is a linear combination of the current input sample and only a finite number of past input samples. The input to the first delay element is the sequence $I_k$ ($Q_k$ for the second filter 42). Each subsequent delay element adds an additional delay to the input sequence. The output of each delay element also provides a first input to a corresponding multiplier 50–58 (even numbers only). A second input to each multiplier is a coefficient supplied by a storage device not shown. The output of each multiplier is an intermediate signal which is input to a summer 58 which, in turn, outputs a filtered sequence $I'_k$ ($Q'_k$ in the case of the second FIR filter 42).

Since the output sampling rate of the FIR is generally an integer multiple of the input sampling rate necessary number of zeros are inserted between each input sample. For example, if the output sampling rate is four times the input sampling rate, then three zeros has to be inserted between each input sample. Hence, for an upsampling ratio of r, only every other r multiplications need to be carried out since those in between will yield zeros. This fact has been used for polyphase implementation of FIR filters. In this implementation, every output sample (phase) of the original FIR filter is considered to be the response of r different FIR filters whose coefficients are related to the original FIR filter in a simple way: each filter is made up of every other r-th coefficient of the original FIR coefficients beginning with the first r coefficients. In any case, each phase of the original FIR filter can be diagrammed as shown in FIGS. 4 and 5.

The outputs of the filters are discrete time sequences at a higher sampling rate than the input. These sequences are converted to analog waveforms via digital to analog converters 43 and 45 (FIG. 2) and form the in-phase and quadrature baseband waveforms I(t) and Q(t) respectively.

For digital modulators employing quadrature spreading, the PN sequences are generated digitally and are therefore represented by binary logical values 0 and 1. Assume that these logical values are mapped to two real values using the mapping

| Logical | Real |
|---------|------|
| 0 | +1 |
| 1 | −1 |

Using this mapping, it is evident that at any time, the in-phase and quadrature phase samples $I_k$ and $Q_k$ are either the same or they differ in sign. Hence, the magnitudes of the present and past values of these input samples are the same for the in-phase and quadrature branches. The present invention exploits this fact by performing only half as many multiply operations. The invention uses only one tapped delay line to store the required samples. The invention then computes the sum of the individual products two times, one for each sign sequence dictated by the in-phase and quadrature spreading sequences.

Figure 6A:
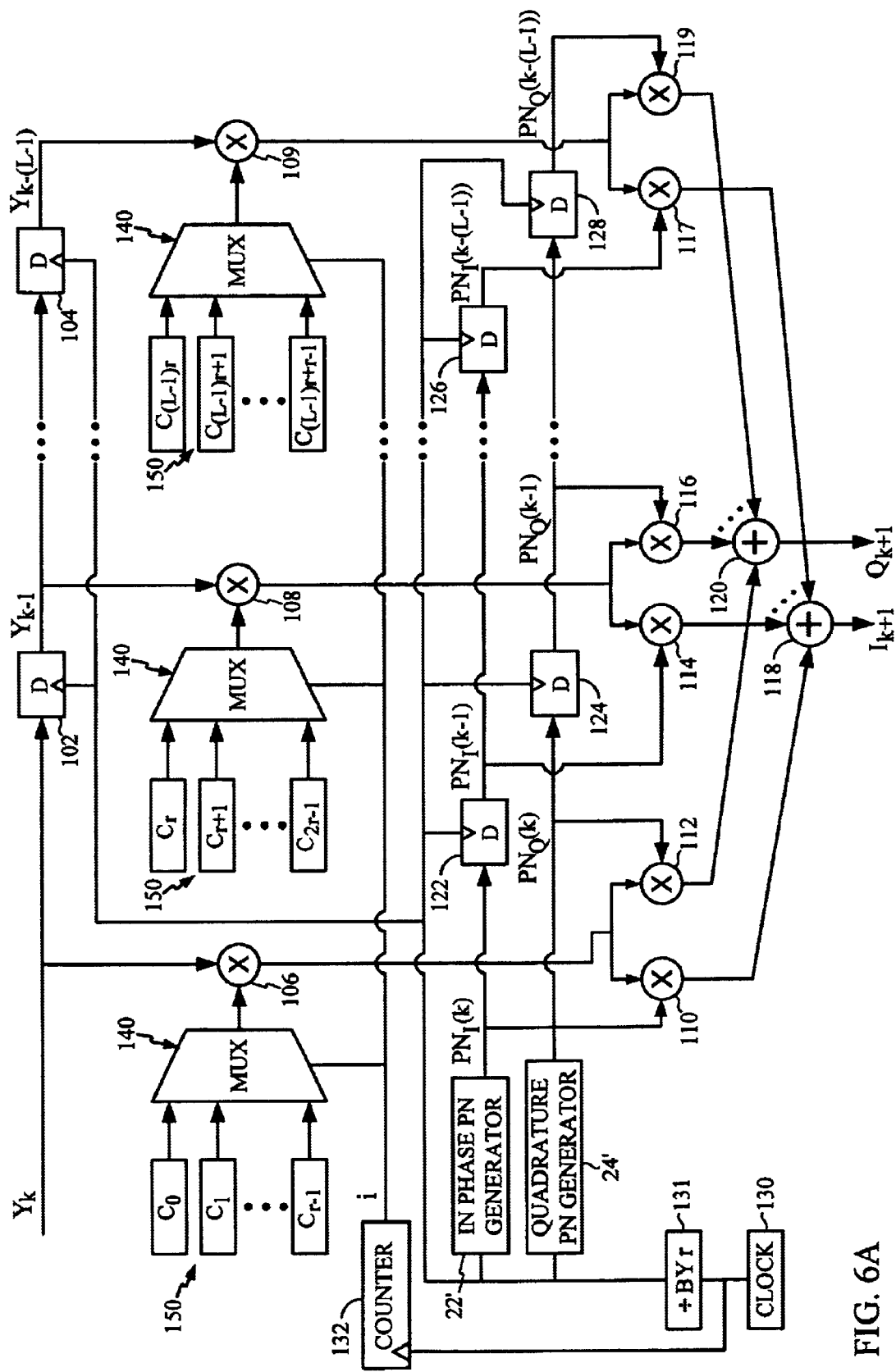
FIG. 6a is a block diagram of the FIR filter of the present invention.

FIG. 6a is a block diagram of the FIR filter of the present invention. The novel FIR design includes plural delay elements 102–104. The tapped outputs of the delay elements are multiplied by a set of coefficients as per the prior art. The coefficients may be supplied from a storage device (shown as a register bank 150) or may be hard coded into the circuit. The set of coefficients to be used for each phase of the filter is chosen by way of a multiplexer (MUX) 140 which is controlled by a counter 132 driven by the system clock 130. The output of the counter cycles through 0, 1, . . . , r−1 sequentially. The multiplexer chooses and applies the i-th input as its output. The output of the first multiplier 106 is input to multipliers 110 and 112. The output of the second multiplier 108 is input to multipliers 114 and 116. Successive stages operate similarly so that for the last stage the output of the L-th multiplier 109 is input to multipliers 117 and 119.

The multiplier 110 multiplies the output of the first multiplier 106 with a corresponding PN sequence number $PN_I(k)$ for the in-phase component supplied by an in-phase PN sequence generator 22'. Likewise, the multiplier 114 multiplies the output of the second multiplier 108 with a corresponding PN sequence number $PN_I(k-1)$ for the in-phase component supplied by the delay element 122 which stores the previous PN sequence generated r clock cycles before. The multiplier 112 multiplies the output of the first multiplier 106 with a corresponding PN sequence number $PN_Q(k)$ for the quadrature phase component supplied by a quadrature PN sequence generator 24'. Similarly, the multiplier 116 multiplies the output of the second multiplier 108 with a corresponding PN sequence number $PN_Q(k-1)$ for the quadrature phase component supplied by the delay element 124 which stores the previous PN sequence output (generated r clock cycles before). Successive stages operate similarly. That is, the multiplier 117 multiplies the output of the L-th multiplier 109 with a corresponding PN sequence number $PN_I(k-1)$ for the in-phase component. This component is supplied by the delay element 126 which stores the PN sequence output generated (L−1)r clock cycles previously. The multiplier 119 multiplies the output of the L-th multiplier 109 with a corresponding PN sequence number $PN_Q(k-(L-1))$ for the quadrature component supplied by the delay element 128 which stores the PN sequence output that was generated (L−1)r clock cycles previously. The multiplication operations shown for the PN sequences are, actually, simple polarity operations.

A first adder 118 provides the in-phase output by summing the outputs of the multipliers 110, 114, . . . , 117. A second adder 120 provides the quadrature output by summing the outputs of the multipliers 112, 116, . . . ,119.

It can be seen that the present invention affords an efficient FIR filter implementation in that the number of delay elements is halved relative to the conventional design and half as many multiply operations are required.

Figure 6B:
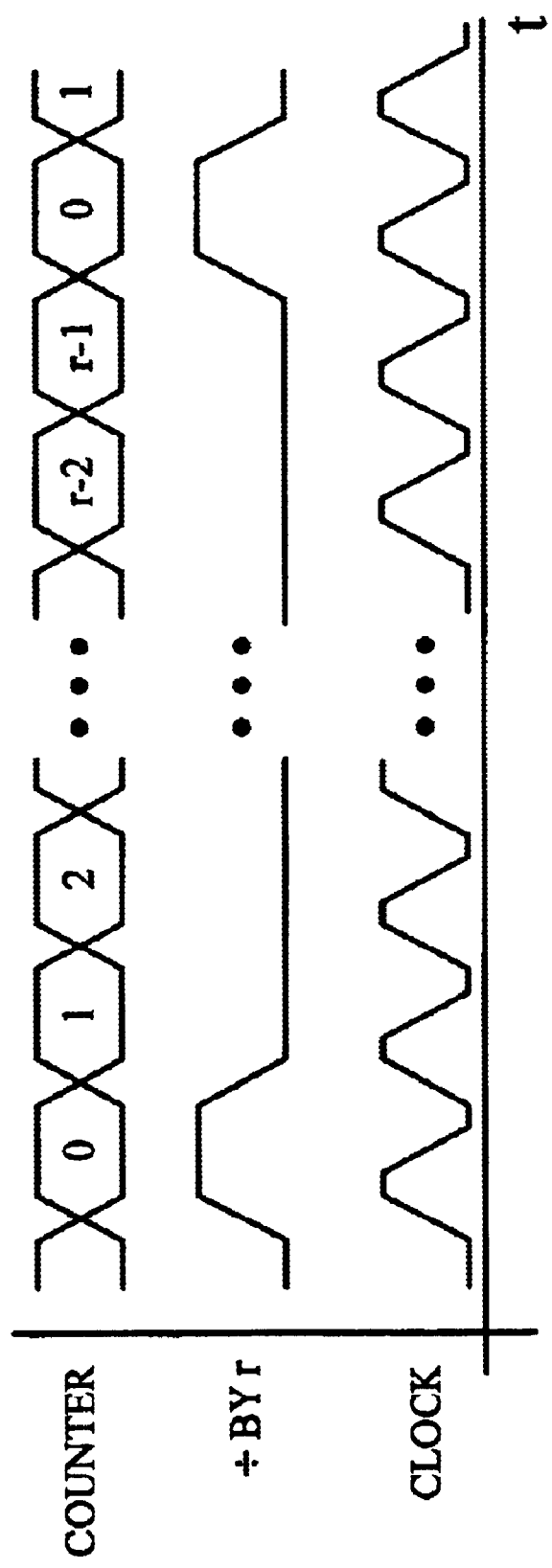

FIG. 6b is a timing diagram illustrative of the operation of the FIR filter of FIG. 6a.

Figure 7:
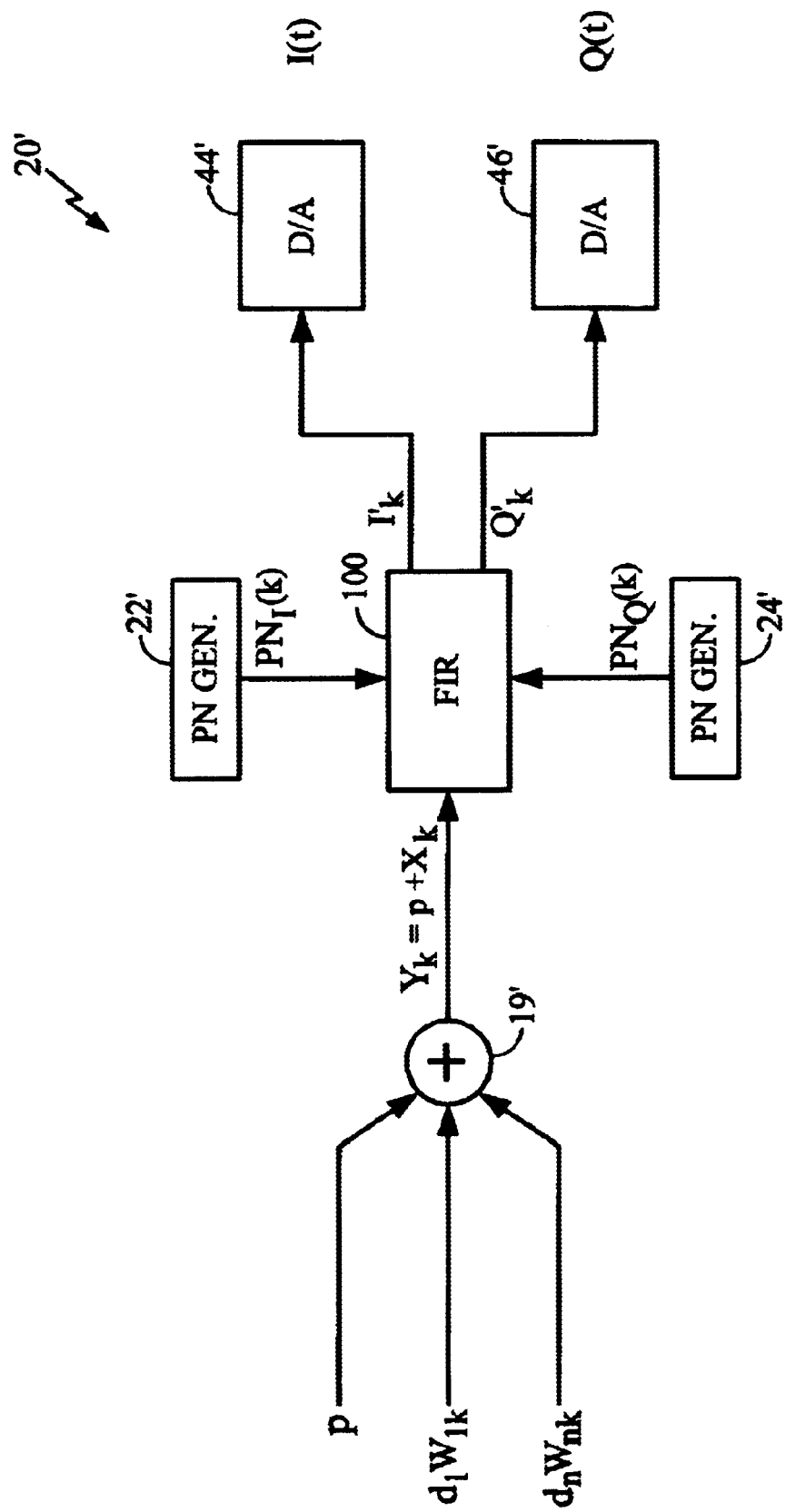
FIG. 7 is a block diagram of a waveform generator constructed in accordance with the teachings of the present invention.

FIG. 7 is a block diagram of a waveform generator with an efficient FIR designed in accordance with the teachings of the present invention. FIG. 7 utilizes a quadrature spreading digital modulation scheme in which a single stream of numbers $Y_k$ is spread with $PN_I(k)$ and $PN_Q(k)$, upsampled and filtered by a finite impulse response (FIR) filter 100. In FIG. 7 as in FIG. 2, d1, . . . $d_n$ refer to the coded symbols of n users and $W_{Ik}$ denotes the k-th chip of the Walsh sequence with index '1'. $Y_k$ is the sum of all user chips and the chips for the pilot tone (which are all constants). The $PN_I(k)$ and $PN_Q(k)$ sequences are provided by first and second PN sequence generators of conventional design 22' and 24', respectively. These sequences are a series of binary values whose function is to randomize the sequence of intermediate products formed by multiplying a finite number of delayed input samples $Y_k$ with a set of the FIR filter coefficients before they are summed to produce the filter output. In accordance with the present teachings, the sequences $PN_I(k)$, $PN_Q(k)$ and $Y_k$ are input to a single baseband pulse shaping FIR filter 100 disclosed above with reference to FIG. 6 to produce two quadrature spread, upsampled and filtered sequences $I_k'$ and $Q_k'$.

The output of the filter 100 consists of discrete time sequences at a higher sampling rate than the input. These sequences are converted to analog waveforms via digital to analog converters 44' and 46' and form the in-phase and quadrature baseband output waveforms I(t) and Q(t) respectively.

Thus, the present invention has been described herein with reference to a particular embodiment for a particular application. Those having ordinary skill in the art and access to the present teachings will recognize additional modifications applications and embodiments within the scope thereof. For example, while the invention has been described in the context of a multichannel transmit system, the use of a single channel transmit system is also possible without departing from the scope of the present invention.

Further, the invention is not limited to the apparatus and/or technique disclosed for changing the sign of the outputs of the first and second multipliers. This step can be executed by multiplication or digitally by simply changing a bit in a register.

It is therefore intended by the appended claims to cover any and all such applications, modifications and embodiments within the scope of the present invention.

Accordingly,

What is claimed is:

1. A finite impulse response filter comprising:

first means for providing plural delayed signals in response to an input signal;

second means for multiplying respective ones of said delayed signals by a corresponding coefficient and providing a respective intermediate signal in response thereto;

third means for selectively changing a sign of respective ones of a first set of said intermediate output signals, which have not been accumulated, to provide a set of component in-phase signals;

fourth means for selectively changing a sign of respective ones of a second set of said intermediate output signals, which have not been accumulated, to provide a set of component quadrature signals;

fifth means for combining said set of component in-phase signals to provide an in-phase output signal; and sixth means for combining said set of component quadrature signals to provide a quadrature output signal.

2. The invention of claim 1 including means for generating said coefficients.

3. The invention of claim 2 wherein said means for generating said coefficients is a storage device.

4. The invention of claim 1 wherein said first means is a delay element.

5. The invention of claim 1 wherein said second means is a multiplier.

6. The invention of claim 1 including means for controlling said third and fourth means.

7. The invention of claim 6 wherein said means for controlling said third and fourth means is a pseudo-noise sequence generator.

8. The invention of claim 1 wherein said third means is a multiplier.

9. The invention of claim 1 wherein said third means is a storage device.

10. The invention of claim 9 wherein said storage device includes means for storing a sign bit.

11. The invention of claim 10 wherein said third means includes means for changing said sign bit.

12. The invention of claim 11 wherein said means for changing said sign bit is a pseudo-noise sequence generator.

13. The invention of claim 1 wherein said fourth means is a storage element.

14. The invention of claim 13 wherein said storage element includes means for storing a sign bit.

15. The invention of claim 14 wherein said fourth means includes means for changing said sign bit.

16. The invention of claim 15 wherein said means for changing said sign bit is a pseudo-noise sequence generator.

17. The invention of claim 1 wherein said fifth means is a summer.

18. The invention of claim 1 wherein said sixth means is a summer.

19. A finite impulse response filter comprising:

plural delay elements for providing plural delayed signals in response to an input signal;

a first circuit for multiplying respective ones of said delayed signals by a corresponding coefficient and providing a respective intermediate signal in response thereto;

a second circuit for selectively changing a sign of respective ones of a first set of said intermediate output signals, which have not been accumulated, to provide a set of component in-phase signals;

a third circuit for selectively changing a sign of respective ones of a second set of said intermediate output signals, which have not been accumulated, to provide a set of component quadrature signals;

a fourth circuit for combining said set of component in-phase signals to provide an in-phase output signal; and a fifth circuit for combining said set of component quadrature signals to provide a quadrature output signal.

20. A finite impulse filter comprising:

first delay means for receiving an input signal and providing a first delayed signal in response thereto;

second delay means for receiving said first delayed signal and providing a second delayed signal in response thereto;

third means for multiplying said first delayed signal by a first coefficient to provide a first intermediate signal;

fourth means for multiplying said second delayed signal by a second coefficient to provide a second intermediate signal;

fifth means for changing a sign of said first intermediate signal, which has not been accumulated, to provide a first in-phase component signal;

sixth means for changing a sign of said first intermediate signal, which has not been accumulated, to provide a first quadrature component signal;

seventh means for changing a sign of said second intermediate signal, which has not been accumulated, to provide a second in-phase component signal;

eighth means for changing a sign of said second intermediate signal, which has not been accumulated, to provide a second quadrature component signal;

ninth means for summing said in-phase component signals to provide an in-phase output signal; and tenth means for summing said quadrature component signals to provide a quadrature output signal.

21. A finite impulse filter comprising:

a first delay element adapted to receive an input signal;

a second delay element adapted to receive the output of said first delay element;

a first multiplier connected to the output of the first delay element;

a second multiplier connected to the output of the second delay element;

a first storage device for providing a second input for said first and said second multipliers;

a third multiplier connected to receive the output of the first multiplier, without accumulation;

a fourth multiplier connected to receive the output of the first multiplier, without accumulation;

a fifth multiplier connected to receive the output of the second multiplier, without accumulation;

a sixth multiplier connected to receive the output of the second multiplier, without accumulation;

a first pseudo-noise sequence generator for providing a second input to said third and said fifth multipliers;

a second pseudo-noise sequence generator for providing a second input to said fourth and said sixth multipliers;

a first summer connected to sum the outputs of said third and said fifth multipliers to provide an in-phase output signal; and a second summer connected to sum the outputs of said fourth and said sixth multipliers to provide a quadrature output signal.

22. A waveform generator comprising:

first means for providing an input signal;

second means for providing an in-phase spreading signal;

third means for providing a quadrature phase spreading signal; and a finite impulse response filter adapted to receive said in-phase and said quadrature phase spreading signals and provide in-phase and quadrature phase filtered output signals in response thereto, wherein said finite impulse response filter comprises:

means for providing plural delayed signals in response to said in-phase and said quadrature phase signal;

means for multiplying respective ones of said delayed signals by a corresponding coefficient and providing a respective intermediate signal in response thereto;

means for selectively changing a sign of respective ones of a first set of said intermediate output signals, which have not been accumulated, to provide a set of component in-phase signals;

means for selectively changing a sign of respective ones of a second set of said intermediate output signals, which have not been accumulated, to provide a set of component quadrature phase signals;

means for combining said set of component in-phase signals to provide the in-phase filtered output signal; and means for combining said set of component quadrature signals to provide the quadrature filtered output signal.

23. A finite impulse response filtering method including the steps of:

providing plural delayed signals in response to an input signal;

multiplying respective ones of said delayed signals by a respective coefficient and providing a respective intermediate signal in response thereto;

selectively changing a sign of respective ones of a first set of said intermediate output signals, which have not been accumulated, to provide a set of component in-phase signals;

selectively changing a sign of respective ones of a second set of said intermediate output signals, which have not been accumulated, to provide a set of component quadrature signals;

combining said set of component in-phase signals to provide an in-phase output signal; and combining said set of component quadrature signals to provide a quadrature output signal.

* * * * *